United States Patent [19]

Cairncross et al.

[11] Patent Number: 5,043,244

[45] Date of Patent: Aug. 27, 1991

[54] PROCESS FOR DEFINED ETCHING OF SUBSTRATES

[75] Inventors: Allan Cairncross, Hockessin; Chester A. Thayer, II, Wilmington, both of Del.

[73] Assignee: E. I. du Pont de Nemours and Company, Wilmington, Del.

[21] Appl. No.: 580,229

[22] Filed: Sep. 10, 1990

[51] Int. Cl.$^5$ .................................................. G03C 5/54
[52] U.S. Cl. .................................... 430/247; 430/205; 430/248; 430/314; 430/317
[58] Field of Search ............... 430/205, 248, 317, 314, 430/231, 232, 247

[56] References Cited

U.S. PATENT DOCUMENTS

| | | | |
|---|---|---|---|
| 3,033,765 | 5/1962 | King et al. | 204/15 |
| 3,424,581 | 1/1969 | Nawn et al. | 96/38.4 |
| 3,464,822 | 9/1969 | Blake | 96/38.4 |
| 3,600,185 | 8/1971 | McGuckin | 96/36.3 |
| 3,822,127 | 7/1974 | Tsuboi | 96/29 |
| 3,969,541 | 7/1976 | Mukaida et al. | 430/232 |
| 4,192,640 | 3/1980 | Merry | 430/248 |
| 4,925,756 | 5/1990 | Cairncross | 430/232 |

*Primary Examiner*—Richard L. Schilling

[57] ABSTRACT

A process is described for defined etching of holes using a sliver mask formed by silver diffusion transfer imaging.

27 Claims, No Drawings

PROCESS FOR DEFINED ETCHING OF SUBSTRATES

FIELD OF THE INVENTION

This invention relates to a process for defined etching of substrates. More particularly, it relates to a process for defined etching of holes using a silver mask formed by silver diffusion transfer imaging.

BACKGROUND OF THE INVENTION

Multilayer electronic circuitry requires that there be electrically conductive interconnective holes or vias between layers. With the growing demand for higher density circuits, there has been an increased need for the vias to be smaller, on the order of 1 mil or less. The usual method for making vias has been to drill holes in a metal-clad dielectric substrate, clean the debris from the hole, etch back the substrate, deposit a thin layer of metal electrolessly on the hole walls, and electroplate metal (usually copper) over this to the desired thickness. This process suffers from the disadvantage that it is limited by the size of available drills and therefore cannot produce holes of less that 3 or 4 mils in diameter. Small diameter drills also are not very durable and tend to dull and break easily.

In a second method, a focussed laser beam is addressed to the spot on a dielectric substrate where a via is desired and the substrate ablated away down to the desired depth. Again the hole may be plated up or filled with a conductor to provide electrical interconnection if necessary. Some small vias can be made this way, but the technique works best on holes of about 5 mils or larger in diameter. In addition, there can be debris left around the hole which needs to be cleaned and the technique can be very slow for a large array of fine holes.

It is therefore an object of the present invention to provide a process for defined etching substrates whereby the etched features can be very small, whereby a large number of features can be made simultaneously, and whereby multiple etching steps are not required.

While the process of the invention is particularly suited for use with insulating substrates for electronic applications, it will be recognized that the process is also suitable for use with other substrates, e.g., metals, conductive films, etc.

Furthermore, while the process of the invention is particularly suited for making small holes and vias for interconnects in electronic circuitry, it is also suitable for etching wells or grooves or cut lines for defining or separating a part.

SUMMARY OF THE INVENTION

This invention relates to a process for etching a pattern of one or more etched features in a substrate which comprises the steps:

(a) applying diffusion transfer nuclei to a surface portion of the substrate, (b) applying a silver halide containing photosensitive material either as a layer on the substrate overlying the diffusion transfer nuclei or as a layer on a second substrate, (c) exposing the photosensitive material to actinic radiation in a pattern corresponding to the desired etched feature pattern, (d) applying developer solution to material exposed in Step (c), (e) forming a pattern of silver as a coating on the substrate by silver diffusion transfer wherein the pattern has no developed silver in the areas to be etched.

(f) removing the layer that originally contained the silver halide material while leaving the pattern of silver formed in Step (e) on the surface of the substrate, and (g) applying an etching treatment to remove the substrate in the areas not covered by silver thereby forming an etched pattern.

DETAILED DESCRIPTION OF THE INVENTION

The present invention relates to a process for forming an etched pattern, which can include holes, in a substrate. This is accomplished by forming an integral silver mask with a pattern on the substrate using silver diffusion transfer imaging. This is followed by an etching step in which the substrate is removed in the areas which are not covered by the silver mask.

Silver diffusion transfer processes are well known as imaging techniques. In these processes, an exposed silver halide emulsion layer is developed in contact with a receptor layer which contains diffusion transfer nuclei. The developer includes a compound which complexes the undeveloped silver halide allowing it to diffuse to the receptor layer where the diffusion transfer nuclei catalyze the formation of metallic silver. In the process of the invention, the substrate is the receptor layer and the metallic silver image that is formed thereon is in a pattern such that there is no silver in the areas where etching is desired.

After etching the substrate in areas not covered by the silver mask, the silver mask can remain on the substrate as an integral part of the final product, or it can be removed. For products where silver migration is a concern, removal of the silver mask is preferred. In the case where the silver is to remain as an integral part of the final product, the processing steps must be chosen so that the silver layer has the necessary physical properties for the final product, i.e., adhesion, mechanical strength, etc.

A particularly important pattern for electronic applications is the holes or vias. The holes may be subsequently plated with conductive metal to form conductive through holes or they may be completely filled with conductive metal to form vias. The substrate may be a single layer of electrically insulating material, or it may be a multilayer structure with alternating layers of insulating material and conductive circuitry. In the case of a multilayer substrate, the holes may be through the top layer of insulating material or through several layers, including holes through the entire multilayer structure. If the silver pattern is to remain as an integral part of the final circuit, the pattern must have the necessary electrical properties in addition to the physical properties discussed above.

The first step in the process of the invention is the application of silver diffusion transfer nuclei to a surface portion of the substrate. The exact choice of substrate will largely depend on the final product for which it is intended. However, the substrate must have sufficient mechanical, thermal and chemical stability to allow for later processing steps.

For electronic application, substrates which can be used in practicing this invention can be either flexible or rigid, must be electrically insulating and have good moisture resistance.

In general, an insulating substrate comprises a polymeric resin which can be in the form of a film or other solid matrix. The resin may be reinforced with stable fibers or inert fillers, cellulosic or polyaramid papers, glass or polyaramid fabrics. Examples of suitable thermoset resins include diallyl phthalates, high performance epoxies, phenolics and silicones. Examples of suitable thermoplastic resins include fluorocarbons, polyimides, polyaryl ethers, polyarylketones, polyaryletherketones; polyesters, polyethyleneoxides, polyphenylene sulfides, polycarbonates, polyphenylene oxides, polysulfones, bismaleimides, bismaleimide triazines, and cyanate esters.

The substrate may also be a laminate of several layers which may be the same or different. For example, epoxy resin reinforced with polyaramid fabrics and laminated to fluoropolymer films can be used. Ceramic materials can also be used as insulating substrates.

The thickness of the substrate will generally depend on the intended end use. However, substrate thickness limits the smallest hole size that can readily be achieved. As a general rule, the smallest hole size is approximately the same as the thickness of the substrate.

The diffusion transfer nuclei are particles which act as catalytic sites to aid in the reduction of complexed silver ions to silver metal. Suitable diffusion transfer nuclei for silver diffusion transfer processes are well known in the art. They typically will be (1) a metal, such as silver, gold, palladium, palladium/tin, copper, iron, rhodium and aluminum; (2) sulfides, selenides, tellurides, polysulfides, or polyselenides of metals including silver, zinc, chromium, gallium, iron, cadmium, cobalt, nickel, manganese, lead, antimony, bismuth, arsenic, copper, rhodium, palladium, platinum, lanthanum, and titanium; (3) easily reducible metal salts which form metal nuclei during processing, such as palladium sulfate, silver nitrate or silver citrate; (4) inorganic salts such as sodium sulfide which react with the incoming diffusing silver salts to form nuclei; and (5) organic compounds which (a) contain a labile sulfur atom and which therefore lead to the formation of sulfide nuclei during processing, including mercaptans, xanthates, thioacetamide, dithiooxamide, and tithiobiurate or (b) are reducing agents such as hydrazine derivatives or silanes. Preferred catalysts are copper, silver, palladium/tin, zinc sulfide, palladium sulfide, copper sulfide, nickel sulfide, palladium salts, and palladium sulfate. Of particular interest are sulfides such as zinc sulfide which are excellent nuclei for silver diffusion transfer imaging but do not catalyze electroless nickel and copper plating if that is desired as a later step.

In some cases the diffusion transfer nuclei particles absorb strongly enough to the untreated surface of substrates to survive the silver diffusion transfer imaging processing steps to give a well defined silver image. This silver mask can be used to define an etching pattern in the substrate directly or can be plated up with more metal and used as a more robust mask to define an etching pattern. In either case, the silver image and the plated up mask will have very little adhesion to the substrate and will usually be removed from the substrate after etching is complete.

The diffusion transfer nuclei may be applied as a coating in a binder. The binder must have enough adhesion to the substrate to allow for later chemical processing and etching steps. The binder must also allow for diffusion transfer development and therefore must be swellable in or wettable by aqueous developer solutions. Typical binders include gelatin, gelatin derivatives, cellulose derivatives, dextrin, soluble starch, polyvinyl alcohol, polystyrenesulfonic acid, and copolymers of acrylic acid. Particularly suitable are the binders disclosed in U.S. Pat. No. 4,931,998. The binder coating can be applied by any conventional coating technique. The amount of nuclei required for adequate image development is generally in the range of 0.01 to 30 mg/cm$^2$ The choice of binder will depend on the final properties required for the etched substrate and whether the metal masks remains or is removed.

For electronic applications, it is preferred that the diffusion transfer nuclei be applied in the absence of a binder to preserve the electronic properties of the substrate. If the silver mask is to remain as an integral part of the final circuit, the surface must be prepared to provide good adhesion to the substrate. This is accomplished by hydrophilizing a surface portion of the insulating substrate and applying the nuclei directly in the absence of a binder as described in assignee's copending patent application U.S. Pat. Ser. No. 437937 filed Nov. 16, 1989, which is herein incorporated by reference. The surface of the insulating substrate is treated, either chemically or physically to make a microscopically thin surface layer more hydrophilic. The treated surface must be swellable in or wettable by the basic aqueous diffusion transfer developer solutions so that diffusion transfer development can take place in depth in the hydrophilized surface layer. The treated surface must also be capable of binding the diffusion transfer nuclei and ultimately the developed silver image with adequate adhesion.

Chemical treatments that are useful generally produce groups on the surface which are polar, often oxygen rich, often binding sites for ions and metals and are hydrophilic, such as hydroxyl, carbonyl, carboxyl, carboxamide groups and the like. In general it is important to minimize the depth of the substrate which is affected by a chemical hydrophilizing treatment. It is preferred that the chemically altered hydrophilic surface layer be from about 0.02 to 0.20 micrometers in thickness.

Physical alterations of the surface that are useful generally increase the surface area without weakening significantly the physical strength of the surface as in the case of treatments that leave loose debris. It is acceptable to have the treatment extend 5 micrometers and more beneath the surface of the insulating substrate for low resolution images. For high resolution and cleaner backgrounds, smoother substrates are better and less than 1 micrometer surface roughness is preferred.

Hydrophilizing treatments include treatments with strong bases, such as methanolic potassium hydroxide, or with aqueous base solutions; treatment with strong reducing agents, such as sodium metal, lithium amalgam, sodium naphthenate, etc.; treatment with strong oxidizing agents, such as chromate, dichromate or permanganate ions, or milder oxidizing agents, such as sodium persulfate; strong acids, such as concentrated sulfuric; surface roughening or abrading mechanically, or by high energy treatment as in argon ion sputtering or excimer laser ablation; and treatment with an electric discharge, corona discharge, reactive plasma, or flame. It will be recognized that the exact hydrophilizing treatment chosen will depend on the nature of the insulating substrate used. When the insulating substrate is a laminate of different materials the surface treatment should be adapted to the material that is on the surface. It will also be recognized that combinations of treatments may be used.

It is also possible to coat the surface of the insulating substrate with another material such as an adhesive layer which is readily hydrophilized on the surface. The coated material must be one which has good adhesion to the insulating substrate, and in addition should have good electrical resistance, chemical resistance, and high temperature stability. Examples of adhesive compositions have been disclosed in U.S. Pat. Nos. 3,728,150, 3,822,175, and 3,900,662. These crosslinkable polymeric acrylic adhesive compositions are particularly suitable for polyimide substrates and can be hydrophilized by a brief treatment with aqueous base catalyzed and processed to give silver diffusion transfer images with good adhesion to the substrate.

The diffusion transfer nuclei may be applied to the treated substrate by conventional application procedures such as spraying, sputtering, printing, brushing, dip coating, roll coating, and the like. A preferred method is to immerse the treated substrate into an aqueous solution or dispersion of the diffusion transfer nuclei. The concentration of diffusion transfer nuclei on the substrate surface must be great enough to result in adequate development of the silver image, but not so great that adhesion suffers or to cause plating in non-image areas for those applications in which the silver image is plated over. It has been found that a level of 0.01 to 30 micrograms/cm$^2$ is preferred; 0.5 to 20 microgram/cm$^2$ is most preferred.

It has been found that best results are obtained when the development nuclei, usually 0.001 to 0.01 micrometers in diameter, penetrate the hydrophilized layer at least 0.02 micrometers. In some cases, the nuclei penetrate and are dispersed throughout the thickness of the hydrophilized layer.

Although it is preferred that the steps of hydrophilizing the insulating substrate and applying diffusion transfer nuclei be carried out sequentially, it is possible for the two steps to be carried out simultaneously. For example, if the surface of the insulating substrate is hydrophilized by treating with strong acid, the acidic solution may also contain diffusion transfer nuclei. The diffusion transfer nuclei would deposit on the surface of the substrate as the surface became hydrophilized.

The next step in the process of the invention is the application of the silver halide containing photosensitive material. This photosensitive material may be applied directly as a layer onto the substrate, after the application of the catalytic nuclei, for a single sheet or diffusion transfer wash off system (DTWO). Alternatively, it may be applied as a layer to a second support for a two sheet or photomechanical transfer system (PMT).

The surface of the substrate containing the diffusion transfer nuclei, either in a binder or in binderless form, may be protected with a release layer before contacting with the silver halide photosensitive layer. The release layer prevents contamination of the silver halide layer by mobile diffusion transfer nuclei and minimizes contamination of the insulating substrate surface with colloidal silver formed in the image development in the silver halide layer. The release layer should be permeable to the diffusion transfer developer and removable during rinse steps right after diffusion transfer development. The release layer should be thin to avoid losing image resolution A thickness of 0.1 to 3.0 micrometers is preferred. Most water swellable, water soluble polymers that are suitable for silver halide photographic coating are suitable as release layers. Examples include gelatin, phthalated gelatin, cellulose derivatives such as carboxymethyl-cellulose and hydroxymethylcellulose, and other hydrophilic high molecular weight colloidal substances such as dextrin, soluble starch, polyvinyl alcohol, or polystyrenesulfonic acid.

The silver halide containing photosensitive layer generally comprises a dispersion of silver halide grains in a hydrophilic binder. The binder can be any of the substances commonly used in diffusion transfer processes such as gelatin, phthalated gelatin, cellulose derivative such as carboxymethylcellulose and hydroxymethylcellulose, and other hydrophilic high molecular weight colloidal substances such as dextrin, soluble starch, polyvinyl alcohol, or polystyrenesulfonic acid. The binder is most conveniently gelatin. The silver halide can be any of the well-known salts used in photographic applications. Representative useful salts include silver chloride, silver bromide, silver iodide, silver chlorobromide, silver iodobromide, and silver chloroiodobromide, either singly or in mixtures. Precipitation of the halide is generally carried out in gelatin using conventional techniques.

The grain size distribution and sensitization of the silver halide can be controlled to adapt the silver halides for the desired photographic process, including laser-imaging, lithographic, direct positive, and the like. The silver halide layer may be either positive or negative-working. Ordinarily, the silver salt dispersions will be sensitized with conventional compounds such as sulfur, gold, rhodium, selenium and the like, or with organic sensitizing dyes such as cyanine, 1,1'-diethyl-4,4'-cyanine iodide, methine and polymethine cyanine dyes, kryptocyanines, merocyanines, and the like. Other additive commonly employed in silver halide photographic compositions, may also be present if desired.

The amount of silver halide present is generally 5 to 80 mg/dm$^2$ silver with 10 to 15 mg/dm$^2$, usually 15 mg/dm$^2$ silver, used for single sheet diffusion transfer wash off version. The lowest silver gives the highest resolution images and may need electroless metal plating for good durability. The highest silver gives maximum conductivity for direct electroplating of the images.

The next step in the process of the invention is the exposing of at least a portion of the silver halide layer to actinic radiation. This can be accomplished using any of the procedures commonly used with silver halide photographic materials, such as by imaging with UV, visible, or infrared light, a cathode ray tube, or laser. Generally, the silver halide layer is exposed imagewise in the pattern of the desired mask. With negative-working silver halide emulsions, the nonexposed areas of the emulsion will correspond with the developed silver pattern on the substrate. With positive-working silver halide emulsions, the exposed areas of the emulsion will correspond with the developed silver pattern on the substrate.

After exposure, the silver halide layer is contacted with a developer solution and pressed into intimate contact with the diffusion transfer nuclei treated substrate layer. For a one-sheet system this is accomplished by passing the sheet through the developer solution. For a two-sheet system the two sheets are wetted with the developer and then pressed together between rollers with the silver halide layer in contact with the side of the substrate which contains the development nuclei.

For negative-working silver halide emulsions the silver halide is rapidly reduced to silver metal by the action of the developer in the areas of the emulsion which have been exposed to activating radiation. At the same time, silver ion complexing agents in the developer form soluble silver ion complexes in the unexposed areas. These complexes diffuse to the surface of the insulating substrate. The diffusion transfer nuclei there act as catalytic sites for physical development to deposit metallic silver from the silver ion complexes. In a one-sheet system the top emulsion layer which originally contained the silver halide is then removed, usually by washing. Preferably the emulsion layer is washed off in an acid solution with a pH in the range of 0–5, usually 10% by volume acetic acid. In a two-sheet system the two sheets are peeled apart thus removing the emulsion layer from the substrate. This results in a positive silver image being formed on the substrate layer. When positive-working silver halide emulsions are used, the silver halide in the exposed areas is complexed and diffuses to the substrate layer. This produces a negative image on the substrate layer. Developing baths for the diffusion transfer process are well known in the art and are described, for example, in Photographic Silver Halide Diffusion Processes by Andre Rott and Edith Weyde (Focal Press, 1972) and Modern Photographic Processing, Vol. 2 by Grant Haist (Wiley 1979).

Following treatment with the developer solution, it may be advantageous that the system be treated with an acid stop. When the acid stop step is not used, the images may be damaged in rinse steps resulting in permanent loss of adhesion and image components even when substantially aged or plated further. By contrast, when the acid stop is used the diffusion transfer image is tougher and may be scrubbed during rinsing, resists scratching when dry, and its adhesion to the substrate actually may improve with age. The acid stop also assists in the removal of the emulsion layer for one-sheet systems. It is preferred that the acid stop be carried out simultaneously with the removal of the layer which originally contained the silver halide (usually gelatin).

The acid stop solution should have a pH less than about 5. A preferred acid stop solution is a 10% by volume aqueous acetic acid solution having a pH of 2.5.

Best results are obtained when the developed silver, like the nuclei, penetrate at least 0.02 micrometers into the hydrophilized surface. This is observed by electron microscopy on this layer. Penetration, which may extend throughout the hydrophilized layer, locks the silver image into the surface and provides good anchorage.

The silver image formed on the substrate is generally very thin. It may be acceptable in some cases to proceed to the etching step directly using only this silver layer as the mask. However, in most cases it is preferred that the silver image be covered over with additional metal to improve the durability of the mask. The additional metal also serves to improve the electrical conductivity for electronic applications in which the mask remains as an integral part of the final circuit. Examples of metals which can be used to cover or plate over the silver image include copper, nickel, gold, silver, palladium, zinc, chromium, tin, lead and cobalt and their alloys. It is also possible to cover the image sequentially with different metals. It is preferred to use copper because of its good electrical properties, stability, and economy.

It has been found that when the silver image is plated over with an additional metal, the size of the pattern openings in the silver mask should be slightly larger than the desired size of the etched features in the final substrate. For example, when the etched feature is to be a hole, the diameter of the hole in the silver mask should be slightly larged than the desired diameter of the hole in the substrate. This is because the plating is not completely vertical and the openings in the silver mask will be somewhat smaller after the plating is complete. The exact amount of decrease in opening size will depend upon the thickness of the plated layer and the plating conditions. It is an advantage of this process that the size of the etched features in the final substrate can be adjusted both in the photographic process producing openings in the silver mask and in the plating process.

The final thickness of the mask, silver plus plated metal, can vary depending on the severity of the etching step and, in some cases, on the intended use of the final product. In general, for reactive ion etching the preferred metal thickness is 4 micrometers or greater. However, depending on the quality of the plating, thicknesses of 2 micrometers can be sufficient. For laser etching, the preferred metal thickness is 9 micrometers or greater, but 7 to 8 micrometers can be possible depending on plating quality and power adjustments on the laser.

In general, when there are no isolated silver elements in the mask the silver image will usually be covered by electroplating. Any standard electroplating procedure can be used for this purpose. If the conductivity of the silver image is too low for electroplating and the image has no isolated image elements, then the silver image first is made conductive by electroless plating a small amount of metal and then plated to final "mask" thickness usually by electroplating.

If there are isolated silver elements in the mask it is generally preferred to use electroless plating techniques in order to cover the silver image. Examples of metals which can be electrolessly plated include copper, gold, nickel, palladium and cobalt and their alloys. As disclosed in U.S. Pat. Nos. 3,600,185 and 3,822,127, silver metal must be catalyzed prior to electroless metal plating. Typically, either aqueous palladium chloride or aqueous potassium chloropalladate is used. However, these heavy metal ion solutions may also activate the non-silver areas of substrates such as hydrophilized Kapton ® polyimide and FR-4 which results in electroless plating over the entire surface. Therefore, it is sometimes necessary to selectively activate the silver image and deactivate the background for electroless plating.

It has been found that this selective activation of the silver over the substrate can be accomplished by treating the developed image and substrate with solutions of Pd(II), Pt(IV) or Rh(III) at high halide concentration and relatively low pH, in the range of 3 or less. Suitable halide ions include chloride, bromide and iodide. Chloride is preferred. The halide concentration of the solution is critical to the deactivation of the non-silver areas. Preferably the halide concentration is greater than 0.03 molar, and most preferably greater than 1.0 molar. At halide concentrations greater than 0.03 molar, the catalytic activation of the substrate is inhibited without affecting the activation of the silver.

It is felt that the palladium, platinum and rhodium ions deposit on the silver pattern as the reduced metal. This is supported by coupled plasma atomic absorption data showing significant concentrations of the non-silver metal on the pattern after activation. It is felt that the halide ions serve to remove nuclei from the non-silver image areas of the substrate by complexing with the metals of the nuclei promoting oxidation and solubilization. The halide also prevents deposition of the palladium, platinum or rhodium ions and complexing ligands such as thiocyanate, cyanide and phosphite are anticipated to be effective as well in preventing unwanted activation of the substrate.

As has been discussed above, in some electronic applications the silver metal mask may remain on the surface of the substrate as an integral part of the final structure. The mask may be etched using conventional techniques to form circuit traces. In general, silver alone will not be used, but rather will be plated over with another metal, usually copper. However, silver metal is known to migrate resulting in applications this is totally unacceptable as it can lead to electrical connection between circuit lines and circuit failure. It has been found that dendrite formation can be almost completely eliminated by using the process disclosed in Patent assignee's copending patent application, U. S. Pat. Serial No. 437,937, filed Oct. 16, 1989. The developed silver, either in the form of a mask or in the form of circuit traces, is plated with another metal, and the plated pattern treated with a such as acidic ammonium persulfate. These samples are tested under temperature, himidity and bias conditions described in ANSI/IPC-FC-241, test method 2.6.3.2. Untreated silver patterns show typical dendrite formation in this test. Overplated silver patterns not treated with a mild etch do not fail the test, but show microscopic dendrite formation after 24 hours of exposure to the test conditions. Silver patterns which have been over-plated and given a mild etch show no silver migration or dendrite formation under the same conditions when examined under a microscope at 1000 X magnification.

It is preferred that after plating, the circuit pattern be left in an acidified state. This acid treatment removes surface ions that are deleterious to surface electrical properties. The acid solution should have a pH less than about 5. Preferred acid rinses are 0.1 N sulfuric or hydrochloric acid.

In some cases it may be advantageous to include a baking or aging step in the process of the invention. This is particularly useful when polyimide is used as the substrate. The baking can be accomplished at a temperature of 150° C. or below, but temperatures as high as 400° C. can be used. The time can be from a few minutes to an hour. Aging generally is accomplished at room temperature for a period of 24 to 72 hours, although longer times can be used. The baking or aging step generally takes place after formation of the silver pattern on the substrate or after the silver image has been covered with at least one conductive metal. The substrate may also be baked after the application of the diffusion transfer nuclei, particularly for substrates coated with crosslinkable polymeric acrylic adhesive materials.

The next step in the process of the invention is the etching of the substrate to form features in the desired locations. It will be appreciated that the choice of etching technique will depend to a large extent on the nature and thickness of the substrate. Examples of etching techniques which can be used include reactive ion plasma etching, laser ablation and chemical etching. Reactive ion etching and laser ablation techniques are well-known and have been used in the electronics industry for some time. For reactive ion etching it is preferred to use oxygen and carbon tetrafluoride as the gas. The excimer laser is usually preferred for laser ablation. Broad beam laser ablation using the process of the invention is particularly effective in that many features can be etched simultaneously. It will be recognized by those skilled in the art that gas flow rates and laser power levels must be optimized for each substrate and silver mask. Chemical etching also can be used but may result in more undercutting of the substrate.

As was discussed above, the silver mask must have sufficient adhesion to the substrate and sufficient durability to adequately protect the substrate from etching in the areas covered. For applications in which the silver mask remains on the substrate in the final product it may be necessary to have even greater adhesion. The actual level of adhesion necessary will depend on the desired use of the final product. The durability of the mask is generally dependent on the thickness of the metal (silver +plated metal). As discussed above, it is preferred that the metal thickness be at least 2 micrometers when reactive ion etching is used and at least 7 micrometeres when laser etching is used.

After the formation of the etched features in the substrate, the silver or silver/metal mask may be removed from the substrate. This is generally accomplished by a chemical etching step, which will be dependent on the nature of the substrate and the plating metal. Suitable etching materials are well known in the art. Photographic bleaches and bleach-fixers dissolve silver as one described, for example, in Photographic Processing Chemistry by L. F. A. Mason (Focal Press, 1975) pp. 211–217. Copper etchants include, for example, sulfuric acid hydrogen peroxide, persulfates, chromic acid, ferric chloride, cupric chloride, and alkaline ammonia etchants, etc. For electronic applications the substrate can be plated with copper metal to form a dielectric/copper laminate with conductive through holes. Circuit traces can then be formed using subtractive or semi-additive processes which are well known in the art.

Alternatively, the silver/metal mask may be left on the substrate. For electronic applications, circuit traces can be formed from the mask using well-known resist technology.

EXAMPLES

The followinq examples are illustrative of but are not to be construed as limiting the invention. All percentages are by weight unless otherwise indicated.

EXAMPLE 1

This example illustrates the preparation of an integral silver plasma etching mask using a photomechanical transfer two-sheet process according to the invention.

A. Substrate Preparation

A 2 mil thick sample of VN200 Kapton ® polyimide film (E. I. du Pont de Nemours & Co., Wilmington, Del.) was immersed in an etchant solution consisting of a mixture of 23% by volume 1 N KOH and 77% ethanol at 23° C. for two minutes. Following this etch the substrate sample was rinsed and scrubbed with 65° C. tap water and air dried.

B. Application of Diffusion Transfer Nuclei

The dried substrate from above was treated as follows:

1. immersed in 0.1 N NaOH for 1 minute at room temperature followed by a water rinse;

2. immersed in an aqueous acid bath which is 23% Shipley Cataprep 404 (Shipley Corp., Newton, MA) for 1 minute at room temperature;

3. immersed in an aqueous colloidal palladium/tin catalyst (Shipley Cataposit 44, Shipley Corp., Newton, MA) for 2 minutes at 45° C.;

4. rinsed for 1 minute in water;

5. immersed in a 10% aqueous solution of fluorboric acid accelerator (Shipley Accelerator 19, Shipley Corp., Newton, MA) for 3 minutes at 23° C.;

6. rinsed for 1 minute in water;

7. dried in air.

C. Imaging

A sheet of commercially available photomechanical transfer photographic paper, Kodak PMT II Negative Paper, KNP (Eastman Kodak Co., Rochester, N.Y.) was exposed by contacting with a positive phototool with a pattern of extremely fine transparent holes ranging from 1 to 5 mils in diameter. The photographic paper was exposed for 5.5 to 6.5 seconds with a light of 1.4 lux intensity from a tungsten source.

D. Development and Photomechanical Transfer

The exposed PMT paper was fed along with the Kapton ® substrate from Step B above into a model 1400 PMT processor (NuArc, Chicago, IL) which was charged with Agfa Gaevert Universal Developer CP297B such that the emulsion side of the PMT paper met the hydrophilized surface of the Kapton ® substrate shortly after wetting with developer to form a laminate. After 60 seconds, the PMT paper was peeled away from the sample revealing shiny dark silver pattern on the substrate. The sample was immediately immersed in a 10% aqueous acetic acid stop bath for 60 seconds at 22° C. The sample was then rinsed in 35° C. water for 2 minutes and air dried. As measured by a Panalyzer model 4000, the Kodak PMT paper contained 11.3 mg/dm$^2$ silver as silver halide before development and 5.9 to 6.8 mg/dm$^2$ silver, or 52.4–60.3%, was transferred to the substrate. The transmission optical density was 2.0–2.4.

E. Reactive Ion Etching

The sample was etched for one hour in a Technics model PE-11A plasma unit. The etching conditions were: 40 cc/min oxygen and 2 cc/min carbon tetrafluoride in a ratio of about 95 to 5 at a power of 400 watts.

Photomicrographs of the etched sample revealed that the Kapton ® substrate had been etched through to the back side in the areas where it was not protected by the deposited silver. The protected areas were relatively intact. However, the silver deposit had been eroded during etching and the holes were tapered and much larger on the plasma side.

EXAMPLE 2

This example illustrates the preparation of an integral silver plasma etching mask using a diffusion transfer washoff one-sheet process according to the invention.

A. Substrate Preparation and Application of Diffusion Transfer Nuclei

This was carried out as in Steps A and B of Example 1.

B. Application of Silver Halide

The Kapton ® substrate from above was coated with silver halide photographic emulsion by holding a loop of the film right at the surface of the emulsion and moving the film to allow one side to skim the emulsion surface. The silver halide in the emulsion was 80% by weight AgCl, 19.5% by weight AgBr, and 0.5% by weight AgI. The emulsion was sensitized with standard gold chloride/thiosulfate and was also spectrally sensitized to the blue argon ion laser line. The final coating resulted in 46 mg/dm$^2$ silver as silver halide on the substrate as measured by a model 4000 Panalyzer.

C. Image Exposure and Diffusion Transfer Washoff Development

The substrate with the photographic emulsion coating from part B was masked in contact with a positive phototool with a pattern of 2 mil diameter transparent holes and exposed for 3 minutes using light of 1.4 lux intensity from a tungsten source.

The exposed sample was immersed for 60 seconds in a solution of 4% sodium sulfate in Universal Developer CP297B (Agfa Gaevert, Teterboro, NJ) at 26° C. The sample was then immersed in an acid stop of 10% by weight acetic acid at 26° C. The sample was held in the acid for 60 seconds and then the emulsion coating was rubbed off with cotton. The sample was then rinsed in tap water at 35° C. for 1 minute.

D. Reactive Ion Etching

The sample was etched for one half hour as in Step E of Example 1.

Photomicrographs of the etched sample revealed that the Kapton ® had been differentially etched as in Example 1. However, the silver in the protected areas was eroded and cracked. As in the previous example, the holes in the Kapton ® substrate were not vertical and were much larger on the plasma side.

EXAMPLE 3

This example illustrates the preparation of a nickel plated integral silver plasma etching mask using a photomechanical transfer two-sheet process according to the invention.

A. Substrate Preparation, Application of Diffusion Transfer Nuclei, Imaging, Development and Photomechanical Transfer This was carried out as in Steps A through D in Example 1.

B. Electroless Nickel Plating

The silver pattern on Kapton ® substrate was activated for electroless plating as follows:

1. immersed in 5% HCl for 1 minute;

2. immersed in 0.02% palladium sulfate for 6 minutes; and 3. immersed in 5% HCl for 1 minute.

The silver pattern was then plated for 5 minutes at 65° C. in Niklad 752 electroless nickel plating bath (Witco Chemical Corp., New Hudson, MI). The final metal thickness was 0.5 to 0.7 micrometers.

C. Reactive Ion Etching

The sample from Step B was etched for one hour as in Step E of Example 1.

Photomicrographs of the etched sample revealed that the Kapton ® substrate had been etched through to the back side in the areas not protected by the deposited silver and nickel. The protected areas were relatively intact. However, the silver and nickel deposits cracked during etching. Plasma penetrated these cracks resulting in the crack pattern being transferred to the Kapton ® surface. The small holes in the Kapton ® substrate were larger on the plasma side.

EXAMPLE 4

This example illustrates the preparation of a nickel plated integral silver plasma etching mask on Kapton ® coated with cured WA adhesive (E. I. du Pont de Nemours & Co., Wilmington, Del.) using a diffusion transfer washoff one-sheet process according to the invention.

A. Substrate Preparation

A 1 mil thick sample of VN100 Kapton ® polyimide film (E. I. du Pont de Nemours & Co., Wilmington, Del.) was coated with liquid WA adhesive (E. I. du Pont de Nemours & Co., Wilmington, Del.) and dried to a thickness of 0.1 mils. The adhesive was cured in an oven at 175° C. for one hour.

B. Application of Diffusion Transfer Nuclei, Application of Silver Halide, and Image Exposure and Diffusion Transfer Washoff Development This was carried out as in Step B of Example 1 and Steps B and C. in Example 2.

D. Electroless Nickel Plating

The silver pattern on Kapton ® substrate was activated and electrolessly plated with nickel as in Step B of Example 3.

E. Reactive Ion Etching

The sample was etched for one half hour as in Step E of Example 1.

Photomicrographs of the etched sample revealed that the Kapton ® substrate and WA adhesive had been preferentially etched where it was not protected by the deposited silver and nickel. The protected areas were relatively intact. However, the silver and nickel deposits cracked during etching. Plasma penetrated these cracks resulting in the crack pattern being transferred to the WA adhesive and Kapton ® surface. The side walls of the etched holes in the Kapton ® substrate were irregular and sloped. The holes were larger on the metal plated side exposed to the plasma than on the under side.

EXAMPLE 5

This example illustrates the preparation of a copper plated integral silver plasma etching mask in registration with a copper plated silver Tape Automated Bonding (TAB) pattern on the opposite side of a 2 mil Kapton ® substrate using silver diffusion transfer imaging of the pattern on both sides in register according to the invention.

A. Substrate Preparation

A 2 mil thick sample of VN200 Kapton ® polyimide film was etched according to the procedure in U.S. Pat. No. 4,725,504, Example 5.

B. Application of Diffusion Transfer Nuclei

This was carried out as in Step B of Example 1.

C. Application of Silver Halide

The Kapton ® substrate from Step B above was skim coated as in Step B of Example 2, but with a yellow light safe silver halide emulsion in which the silver halide was 100% AgCl, chemically sensitized with thiosulfate. The emulsion contained no hardener. The coating contained 10.8 to 15.2 mg/dm$^2$ silver (as silver halide) on each side as measured by a model 4000 Panalyzer.

D. Image Exposure and Diffusion Transfer Washoff Development

The coated film from Step C. above was slipped between 2 phototools that were taped together in register along one edge with emulsion sides facing each other. One phototool was the positive image of a TAB pattern containing 2 mil leads and 4 mil spaces. The second phototool was the positive image of the corresponding ground plane for the backside of a 2 conductor (2C) TAB containing several openings, one a central square window where the TAB will be bonded to a chip, four more around the square where the TAB leads will be cut out, and several sprocket holes along two edges for film transport. This sandwich was drawn down in a vacuum frame and exposed by a 1000 watt tungsten halogen lamp at 122 cm for 45 seconds. The vacuum was released, the sandwich turned over, and then drawn down and exposed again for 45 seconds on the second side. The 2 mil Kapton ® substrate effectively absorbed all ultraviolet light so the exposure on one side did not go through to the other side allowing the two sides to be imaged independently but in register.

The exposed sample was developed by silver diffusion transfer washoff development as in Step C of Example 2. The transmission optical density was 5.0 to 5.4. A volt/ohm meter measured 5 to 7 ohms on each side when probes contacted the developed silver about 1 cm apart.

E. Electroplating with Copper

The sample from Step D above was electroplated in an acid copper sulfate plating bath (Copper Gleam 125, from LeaRonel, Freeport, N.Y.). The bath had the following composition:

| Component | % (wt. or vol.) | |
|---|---|---|
| Copper Gleam 125 Carrier | 1.0 | (v) |
| Copper Gleam 125 Additive | 0.5 | (v) |
| Sulfuric Acid | 10.0 | (v) |
| HCl, concentrated | 0.016 | (v) |
| CuSO$_4$.5H$_2$O | 7.5 | (w) |
| Carbon Powder (S free) | 0.6 | (w) |
| Carbon Granules (S free) | 0.9 | (w) |

Several samples were plated at about 15 to 20 amps per square foot for 15 minutes and 30 amps per square foot for various times to get a range of plated up thicknesses from 0.6 mils to 1.4 mils copper per side.

F. Reactive Ion Etching

The samples were etched using a PlasmaTherm reactive ion etcher (80/20 CF4/02 at 400 watts) for 110 minutes.

Two different TAB patterns were etched using the silver transfer mask successfully. The metal thickness per side varied from 0.6 mil to 1.4 mil with no difference seen between the two samples.

EXAMPLES 6 and 7

These examples illustrate the use of an copper-plated integral silver etching masks with laser etching and the effect of mask metal thickness.

A. Substrate Preparation, Application of Diffusion Transfer Nuclei, Imaging, Development and Photomechanical Transfer This was carried out as in Steps A through D in Example 1.

B. Electroplating with Copper

This was carried out as in Step E of Example 5.

The final metal thickness (silver +copper) was 8-9 micrometers in Example 6; 1-2 micrometers in Example 7.

C. Laser Etching

The exposed fine holes were ablated using a Lumonics Index 600 excimer laser, Lumonics Inc., Kanata, Ontario, Canada operating at 248 nm. The output power on the laser was about 200 millijoules with the actual fluence at the part being about 600 millijoules $cm^2$. The approximate beam size was 2 $cm^2$, and nearly 250 pulses were required to remove the Kapton ®.

In Example 6 (8-9 micrometers of metal thickness in the mask) the Kapton ® substrate was removed in the uncovered hole areas while all areas covered by the silver/copper mask resisted any ablation of the Kapton ® substrate. While there was some material around the edges of the holes, this could be removed by techniques such as high pressure air. The holes produced showed sidewall angles of about 75 degrees for 2 mil holes.

In Example 7 (1-2 micrometers of metal thickness in the mask) the metallization was removed from the Kapton ® substrate during the etching step and there was some damage to the Kapton ® substrate in those areas.

EXAMPLES 8 and 9

These examples illustrate the effect of silver/copper mask thickness in reactive ion etching.

A. Substrate Preparation, Application of Diffusion Transfer Nuolei, Imaging, Development and Photomechanical Transfer, and Electroplating with Copper This was carried out as in Steps A and B of Examples 6 and 7. In Example 8 the final metal thickness (silver +copper) was 5-6 micrometers; in Example 9 the final metal thickness was 1-2 micrometers.

B. Reactive Ion Etching

The samples were etched using a PlasmaTherm reactive ion etcher (80/20 CF4/02 at 400 watts) for 110 minutes.

In Example 8, 1-2 mil diameter holes were etched with sidewall angles of about 70-75°. The areas which were covered by the silver/copper mask were undamaged.

In Example 9, the Kapton ® substrate in areas covered by the silver/copper mask was damaged.

EXAMPLE 10

This example illustrates that substrate preparation is not required to form a useful integral etching mask using a photomechanical transfer two-sheet process according to the invention.

A mask was prepared as in Examples 6 and 7 except that no substrate preparation was done, i.e., Step A of Example 1 was omitted.

The silver metal on the sample was electroplated with copper to a final metal (silver +copper) thickness of 15 micrometers, which closed the mask holes to less than 1 mil in diameter. Then the sample was reactive ion etched as in Example 1, Step E.

Results were similar to those described in Example 6 and showed that the silver transfer mask functions well in forming holes of less than 1 mil in diameter through 2-mil thick Kapton ® substrate.

EXAMPLE 11

This example illustrates that neither substrate preparation nor sodium hydroxide conditioning is required to form a useful integral etching mask using a photomechanical transfer two-sheet process according to the invention.

Masks were prepared as in Examples 6 and 7 except that both substrate preparation, Step A of Example 1 and sodium hydroxide conditioning Step B, 1 of Example 1 were omitted.

In Example 12 the silver metal on the sample was electroplated with copper to a final metal (silver+copper) thickness of 15 micrometers, which closed the mask holes to approximately 1 mil diameter. The sample was reactive ion etched as in Example 1, Step E.

Results were similar to those described in Example 6 and showed that the copper-plated silver transfer mask functions well in forming holes approximately 1 mil in diameter through 2 mil thick Kapton ®substrate.

EXAMPLE 12

This example illustrates that an acrylic polymer containing catalyst may be substituted for the surface preparation and catalyzation to form a useful integral etching mask using silver diffusion transfer washoff one-sheet process according to the invention.

Masks were prepared as in Example 2 except that an acrylic binder containing catalyst as in Example 29 of U.S. Pat. No. 4,913,998 was substituted for step A, Substrate Preparation and Application of Diffusion Transfer Nuclei. The actual acrylic binder consisted of a tetrapolymer of styrene/methyl methacrylate/methacrylic acid/ethyl acrylate in the molar ratio 30/10/20/40 containing about 1 weight % zinc sulfide 11% EPI-REZ 5022 (diglycidyl ether of 1.4-butanediol, Celanese Corp.) and 2% tetraethyl ammonium hydroxide coated at 5.8 mg/$dm^2$ on 2 mil VN Kapton ® substrate and cured 15 minutes 15 95° C. A photographic emulsion, spectrally sensitized to the blue argon ion emmission, was skim pan coated at 63 mg/$dm^2$ silver as silver halide over the acrylic binder.

As in Example 2, step C, the sample was exposed through a target having uniform diameter openings of 2 mils such that, after development, the silver diffusion transfer image on the Kapton ® substrate has silver-free holes of 2.2 to 2.3 mil diameter. The amount of developed silver averaged 20 mg/$dm^2$ and the image measured one ohm resistance between 2 point probes from an ohm meter separated 1 centimeter apart. This sample with the silver image was further heated at 95–105° C. for 15 minutes before plating.

When electroplated up to the desired final mask thickness of 5 microns the 2.2 to 2.3 mil openings closed to the goal 2 mils since the copper plates both vertically and horizontally around the perimeter of the opening. Finally the sample was reactive ion etched as in Examples 8 and 9, step B.

Results were similar to those described in Example 8 and showed that the copper plated silver transfer mask on an acrylic binder layer functions well in forming 2 mil diameter holes in the 2 mil thick Kapton®substrate.

EXAMPLE 13 and 14

These samples illustrate the use of an acrylic polymer binder for the activation nuclei on Cronar® polyester film (E. I. du Pont de Nemours and Co., Wilmington, Del.) to form a useful integral etching mask using silver diffusion transfer washoff one-sheet process according to the invention.

Masks were prepared as in Example 12 except that a mil Cronar® polyester film was the substrate, the acrylic binder containing zinc sulfide catalyst was coated at 6.3 mg/dm$^2$, the silver halide emulsion was coated at 51.9 mg/dm$^2$ silver as silver halide.

An integral silver mask was formed on the Cronar® substrate using the imaging and development process of Example 2, step C.

The silver on Example 13 was electroplated with a fine grain copper using the acid copper plating bath of Example 5, step E to a final metal thickness of 2 microns and to 9 microns metal thickness on Example 14. Then the samples were reactive ion etched as in Example 8, step B.

Results were similar to those described in Example 8 and showed that the copper plated silver transfer mask functions well in forming 2 mil diameter holes with some undercutting through 4 mils of polyester film. The 2 micron thick metal mask of Example 13 showed no damage or significant change in appearance.

What is claimed is:

1. A process for making a pattern of one or more etched features in a substrate which comprises the steps:
   (a) applying diffusion transfer nuclei to a surface portion of the substrate,
   (b) applying a silver halide containing photosensitive material either as a layer on the substrate overlying the diffusion transfer nuclei or as a layer on a second substrate,
   (c) exposing the photosensitive material to actinic radiation in a pattern corresponding to the desired etch pattern,
   (d) applying developer solution to material exposed in Step (c),
   (e) forming a pattern of silver as a coating on the substrate by silver diffusion transfer wherein the pattern has no developed silver in the areas to be etched,
   (f) removing the layer that originally contained the silver halide material while leaving the pattern of silver formed in Step (e) on the surface of the substrate, and
   (g) applying an etching treatment to remove the substrate in the areas not covered by silver thereby forming an etched pattern.

2. The process of claim 1 wherein the etched features include at least one hole.

3. The process of claim 1 wherein the silver pattern from Step (f) is plated over with a second metal prior to Step (g).

4. The process of claim 3 wherein the second metal is selected from the group consisting of copper, nickel, gold, silver, palladium, lead, zinc, chromium, tin, iron and cobalt.

5. The process of to claim 1 wherein the etching treatment in Step (g) is selected from the group consisting of reactive ion etching, laser ablation and chemical etching.

6. The process of claim 5 wherein the etching treatment is reactive ion etching and the total metal thickness on the substrate is at least 2 micrometers.

7. The process of claim 5 wherein the etching treatment is laser etching and the total metal thickness on the substrate is at least 7 micrometers.

8. The process of claim 1 wherein the substrate is electrically insulating.

9. The process of claim 8 wherein the insulating substrate is selected from the group consisting of polyimide, polyester, and epoxy resin reinforced with glass fabric.

10. The process of claim 9 wherein the substrate is a polyimide film coated with a crosslinkable polymeric acrylic adhesive.

11. The process of claim 1 wherein the substrate is a composite of two or more layers.

12. The process of claim 1 wherein the silver halide containing photosensitive material is applied as a layer overlying the diffusion transfer nuclei on the substrate and further wherein a release layer is applied to the substrate subsequent to Step (a) and between the diffusion transfer nuclei and the silver halide containing photosensitive material.

13. The process of claim 12 wherein the release layer comprises a material selected from the group consisting of gelatin, phthalated gelatin, cellulose derivatives and polyvinyl alcohol.

14. The process of claim 1 which further comprises the steps:
   (i) applying a coating of a conductive metal to the etched substrate from step (g), and
   (j) removing selected portions of the total metal coating to form a circuit pattern.

15. The process of claim 1 which further comprises the step (h) removing the metal pattern completely from the etched substrate from step (g).

16. The process of claim 15 which further comprises the steps
   (i) applying a coating of a conductive metal to the silver-free etched substrate from step (h), and
   (j) removing selected portions of the conductive metal coating to form a circuit pattern.

17. The process of claim 1 wherein prior to Step (a) a hydrophilic treatment is applied to the insulating substrate to impart hydrophilicity to a surface portion of the substrate and further wherein the diffusion transfer nuclei in Step (a) are applied in the absence of a binder.

18. The process of claim 17 wherein the silver pattern from Step (f) is plated over with a second metal prior to Step (g).

19. The process of claim 18 wherein the second metal is selected from the group consisting of copper, nickel, gold, silver, palladium, lead, zinc, chromium, tin, iron and cobalt.

20. The process of claim 17 wherein the etching treatment in Step (g) is selected from the group consisting of reactive ion etching, laser ablation and chemical etching.

21. The process of claim 17 wherein the insulating substrate is selected from the group consisting of polyimide, polyester, and epoxy resin reinforced with glass fabric.

22. The process of claim 21 wherein the substrate is a polyimide film coated with a crosslinkable polymeric acrylic adhesive.

23. The process of claim 17 wherein the substrate is a composite of two or more layers.

24. The process of claim 17 wherein the substrate has a three-dimensional surface.

25. The process of claim 17 wherein the silver halide containing photosensitive material is applied as a layer overlying the diffusion transfer nuclei on the insulating substrate and further wherein a release layer is applied to the insulating substrate subsequent to Step (a) and between the diffusion transfer nuclei and the silver halide containing photosensitive material.

26. The process of claim 25 wherein the release layer comprises a material selected from the group consisting of gelatin, phthalated gelatin, cellulose derivative and polyvinyl alcohol.

27. The process of claim 17 which further comprises treating the developed pattern of silver with an acidic solution having a pH of from about 0 to 5, wherein said acid treatment is carried out simultaneously with or immediately after Step (f).

* * * * *